(12) United States Patent
Lee et al.

(10) Patent No.: US 6,360,033 B1
(45) Date of Patent: Mar. 19, 2002

(54) OPTICAL SWITCH INCORPORATING THEREIN SHALLOW ARCH LEAF SPRINGS

(75) Inventors: Jong Hyun Lee, Taejon; Myung Lae Lee, Pusan, both of (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/475,051

(22) Filed: Dec. 30, 1999

(30) Foreign Application Priority Data

Nov. 25, 1999 (KR) .............................................. 99-52684

(51) Int. Cl.$^7$ .............................. G02B 6/26; G02B 6/42
(52) U.S. Cl. .............................. 385/18; 385/16; 385/19; 385/47; 359/224
(58) Field of Search .............................. 385/18, 19, 16, 385/47; 359/196, 223, 224, 227, 872, 881

(56) References Cited

U.S. PATENT DOCUMENTS

| | | | |
|---|---|---|---|
| 5,208,880 A | 5/1993 | Riza et al. | 385/18 |
| 5,345,521 A | 9/1994 | McDonald et al. | 385/19 |
| 5,446,811 A | 8/1995 | Field et al. | 385/23 |
| 5,867,302 A | * 2/1999 | Fleming | 359/224 |
| 5,994,816 A | * 11/1999 | Dhuler | 310/307 |
| 6,229,640 B1 | * 5/2001 | Zhang | 385/16 |
| 6,236,139 B1 | * 5/2001 | Hill | 310/307 |

OTHER PUBLICATIONS

Juan, et al.; High–Aspect–Ratio Si Vertical Micromirror Arrays for Optical Switching; Jun. 1998; pp. 207–213.
Toshiyoshi, et al.; Electrostatic Micro Torsion Mirrors for an Optical Switch Matrix; Dec. 1996; pp. 231–237.
Lee, et al.; Bi–staple Planar Polysilicon Microactuators with Shallow Arch–shaped Leaf Springs; Sep. 1999; pp. 274–280.
Lin, et al.: Free–Space Micromachined Optical Switches with Submillisecond Switching Time for Large–Scale Optical Crossconnets; Apr. 1998; pp. 525–527.

* cited by examiner

*Primary Examiner*—Darren Schuberg
*Assistant Examiner*—Leo Boutsikaris
(74) *Attorney, Agent, or Firm*—Jacobson Holman, PLLC

(57) ABSTRACT

An optical switch selectively transmits an optical signal to one of multiple optical paths for use in an optical communication. The optical switch includes a mobile structure provided with a mirror surface at one end surface of the mobile structure to change the optical path by moving the mobile structure backward and forward along an axis parallel to the mirror surface. It has at least a pair of leaf springs in the form of a shallow arch, wherein each of the leaf springs is connected to both side surfaces of the mobile structure in a leaf spring axis perpendicular to the mirror surface, respectively, thereby obtaining a latch-up function and an actuator for moving the mobile structure. In the optical switch, elastic bodies are introduced into connection portions of the leaf springs, respectively, to give rise to a degree of freedom to the connection portions in the direction of the leaf spring axis. The elastic body can be an I-shape beam, a multiple spring with a curvature and an S-shape beam allowing angle deflection.

10 Claims, 7 Drawing Sheets

FIG. 4A
(PRIOR ART)
FIG. 4B
(PRIOR ART)
FIG. 4C
(PRIOR ART)
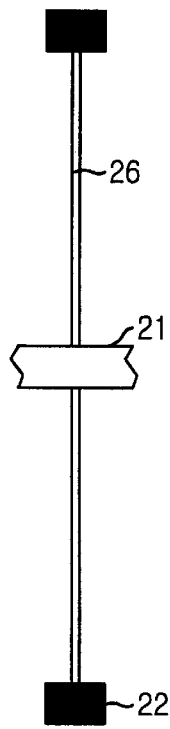
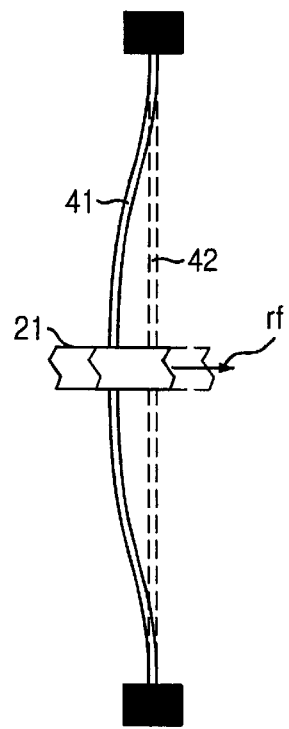
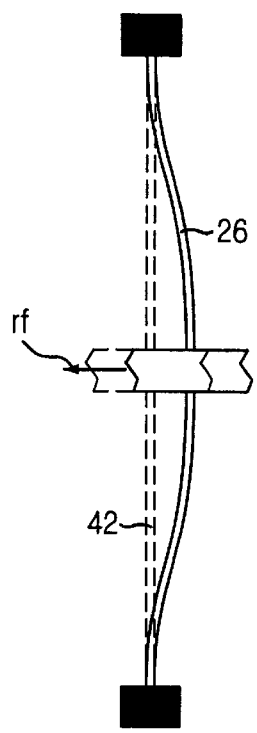

OPTICAL SWITCH INCORPORATING THEREIN SHALLOW ARCH LEAF SPRINGS

FIELD OF THE INVENTION

The present invention relates to an optical communication system; and, more particularly, to an optical switch for selectively transmitting an optical signal to one of multiple optical paths.

DESCRIPTION OF THE PRIOR ART

Generally, an optical communication system has been used for achieving a high rate of data transmission performance by using optical fibers. For example, information in the fiber optic communication system may be sent in the form of optical pulses at a rate of 100 to 2,500 megapulses per second. In general, to change directions of optical transmissions a switch for use in the optical communication system has M numbers of inputs and N numbers of outputs, wherein both M and N are positive integers.

FIG. 1A is a layout of a prior art optical switch, which represents a 2×2 matrix structure having two inputs and two outputs.

Referring to FIG. 1A, actuators are provided with mirror surfaces 13a to 13d, which are located at an end of each actuator and inclined at a 45-degree angle. Each of the mirrors is capable of reflecting a light incident thereon. In case when the actuators 111, 114 turn on and the actuators 112, 113 turn off, the first and the fourth mirror surfaces 13a, 13d are moved forward, thereby making lights from optical fibers 181, 182 travel to optical fibers 183, 184, respectively.

On the other hand, if the actuators 112, 113 turn on and the actuators 111, 114 turn off, the second and the third mirror surfaces 13b, 13c are moved forward, thereby making lights from optical fibers 181, 182 travel to optical fibers 184, 183, respectively, as shown in FIG. 1B.

As described above, there is a need for designing an array of M×N actuators which is capable of transmitting optical signals emitted from M numbers of input optical fibers to other N numbers of output optical fibers. Each of the optical fibers 181, 182 includes a first groove 14-1 at an input terminal thereof to mount a first microlens 15 which collimates a light beam incident thereon. And each of the optical fibers 183, 184 includes a second groove 14-2 at output terminals thereof to mount a second microlens 16 which focuses a light beam incident thereon. The light beam from the second microlens 16 travels along a trench 17. At this time, it is required that an optical waveguide is used for reducing an optical loss due to the divergence of the light beam.

U.S. Pat. No. 5,208,880 issued to Liza et al., entitled "Microdynamical Fiber-optic Switch and Method of Switching Using same", discloses one of conventional optical switches including a mechanical support structure incorporating therein a piezoelectric material in the form of a ladder and a mirror. They are mechanically secured to the central portion of the support structure for modulating an optical path of a light beam incident on the mirror by applying an electric signal to the piezoelectric material. It takes advantage of the support structure to obtain a long operational distance by using a low voltage, however, it has a shortcoming that an accuracy of the position control of the mirror can be deteriorated.

U.S. Pat. No. 5,446,811 issued to Field et al., entitled "Thermally Actuated Optical Fiber Switch", discloses a micromachined device for selectively switching an optical fiber between first and second positions. The micromachined device includes a working leg and a second leg which has a cross-sectional area that is larger than that of a working leg, thereby presenting an electrical resistance difference between the working leg and the second leg to a current flow. The difference in electrical resistance provides a difference in thermal expansion so that the working leg deforms in the direction of the second leg. Therefore, if optical fibers are mounted on grooves formed on the legs and current flows to the legs, the structure serves as a 1×N optical switch. However, this structure suffers from large power dissipation since it employs a thermal actuating method. Further, since the legs cannot be linearly moved, it gives rise to angle deflection errors in the output optical fibers. In addition, it is impossible to make an M×N optical switch because the number of the input optical fibers is limited to one.

U.S. Pat. No. 4,759,579 issued to Lemonde, entitled "Mechanical Switch for Optical Fiber", teaches an optical switch including a rigid arm in the form of a seesaw and a pair of superposed slabs. The rigid arm carries a moving optical fiber and each slab is provided with an alignment groove mounting thereon a fixed optical fiber. In this optical switch, the moving optical fiber is selectively coupled to fixed optical fibers according to the movement of the seesaw rigid arm. This structure has a high accuracy in aligning the optical fibers, however, it is limited to expand the number of the fixed optical fibers.

In an article of IEEE, Photonics Technology Letters, Vol. 10, No. 4, pp. 525–527, April 1998, entitled "*Free-Space Micromachined Optical Switches with Submilisecond Switching Time for Large-Scale Optical Crossconnects*", a mirror surface formed on a silicon surface changes an optical path by using Scratched Drive Actuator (SDA) which moves the mirror surface sanding normal to the silicon surface. However, this method needs 100 volts, 500 MHz operating voltage, and also needs a feedback control since inaccurate mirror positions due to the mirror wearing makes an optical path changed unnecessarily.

In an article of IEEE, Vol. 5, No. 4, pp. 231–237, December 1996, entitled "*Electrostatic Micro Torsion Mirrors for an Optical Switch Matrix*", there is disclosed an optical switch which includes a mirror surface formed on a silicon surface with standing perpendicular to the silicon surface and a dummy substrate to secure the mirror surface attached thereto. Since, however, this optical switch has many obstacles in production. That is, it needs high, e.g., 100 volts and a temporary support in manufacturing processes.

In an article of IEEE, Vol. 5, No. 2, pp. 207–213, June 1998, entitled "*High-Aspect Ratio SI Vertical Micromirror Array for Optical Switching*", there is disclosed an optical switch which includes an actuator and a mirror attached to the actuator with standing perpendicular to a surface of the actuator. This method has a problem that the voltage must apply at least 50 volts to the actuator during OFF state.

In view of the above-described patents and papers, the conventional optical switches should be still improved in position accuracy, power dissipation, scalability and productivity.

SUMMARY OF THE INVENTION

It is, therefore, a primary object of the present invention to provide an improved optical switch with a latchup structure which is obtained by utilizing a leaf spring.

In accordance with the present invention, there is provided an optical switch for selectively changing an optical path of an optical signal for use in an optical communication, comprising: a mobile structure provided with a mirror surface at one side of the mobile structure to change the optical path by moving backward and forward the mobile structure along an axis parallel to the mirror surface; at least a pair of leaf springs in the form of a shallow arch, wherein the pair of leaf springs is connected to both sides of the mobile structure in a direction perpendicular to the mirror surface, respectively, thereby obtaining a latch-up function; and an actuator for moving the mobile structure.

Preferably, in order to give the degree of freedom to a leaf spring in the axial direction thereof and to reduce a critical force required in the reverse direction of the buckling, an elastic body is connected between the connection portions in perpendicular to the leaf spring, wherein the elastic body is selected from a group consisting of an I-shape beam, a multiple spring with a curvature and a S-shape beam allowing angle deflection.

And also, the mobile structure is made of a crystalline silicon or a polycrystalline silicon to secure high density and stability, and it is preferable that a sacrificial layer formed bottom of the mobile structure is made of silicon dioxide.

More preferably, a mirror surface is designed in the form of a concave lens in one dimension or in two dimension to reduce the divergence of optical signals, wherein the mirror surface is deposited with a metal selected from a group consisting of an aluminum, gold and nickel to effectively reflect the optical signal impinged onto the mirror surface

BRIEF DESCRIPTION OF THE DRAWINGS

The above and other objects and features of the present invention will become apparent from the following description of preferred embodiments given in conjunction with the accompanying drawings, in which:

FIG. 2 shows an optical switch in accordance with present invention, when an actuator of an optical switch is turned on;

FIGS. 4A to 4c show an exemplary view for depicting an operation of a conventional optical switch having a leaf spring in the form of a straight line;

DETAILED DESCRIPTION OF THE PREFERRED EMBODIMENTS

Figure 1A:
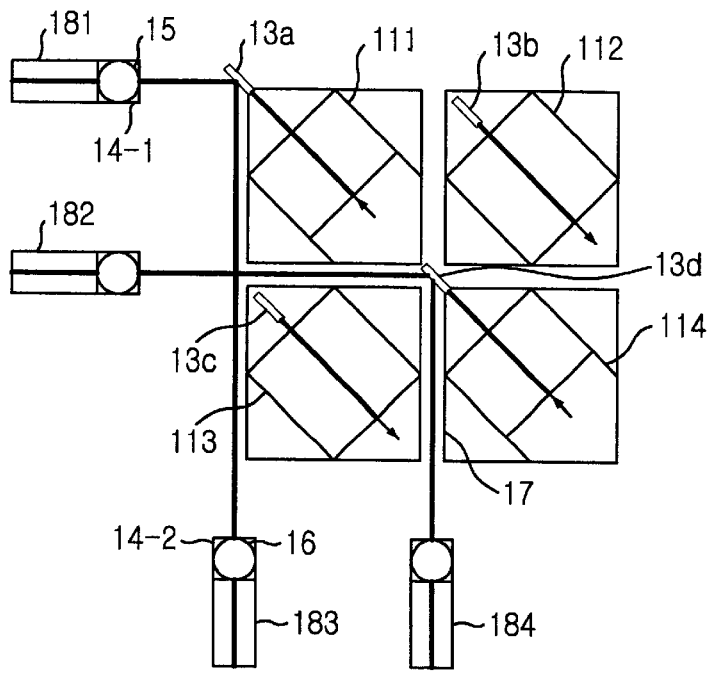
FIGS. 1A and 1B represent a layout of a prior art 2×2 matrix type of an optical switch.
Figure 1B:
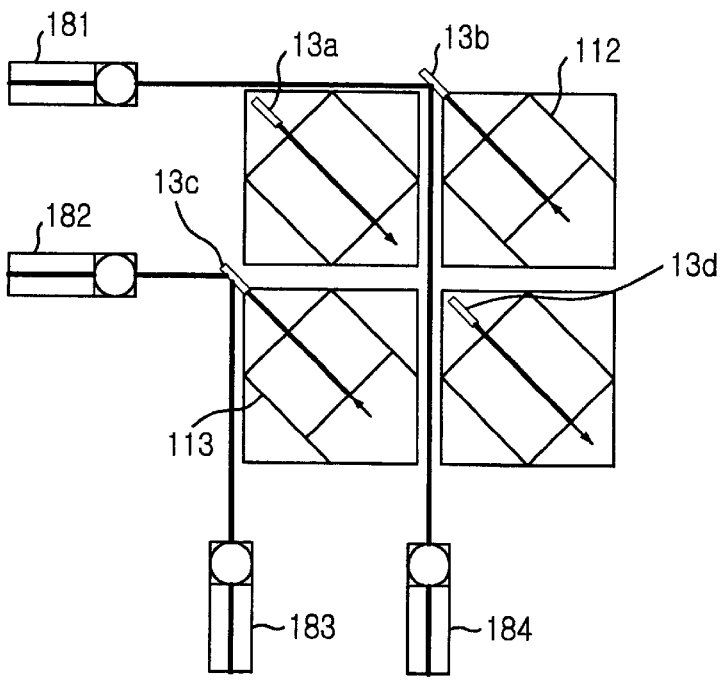
Figure 2:
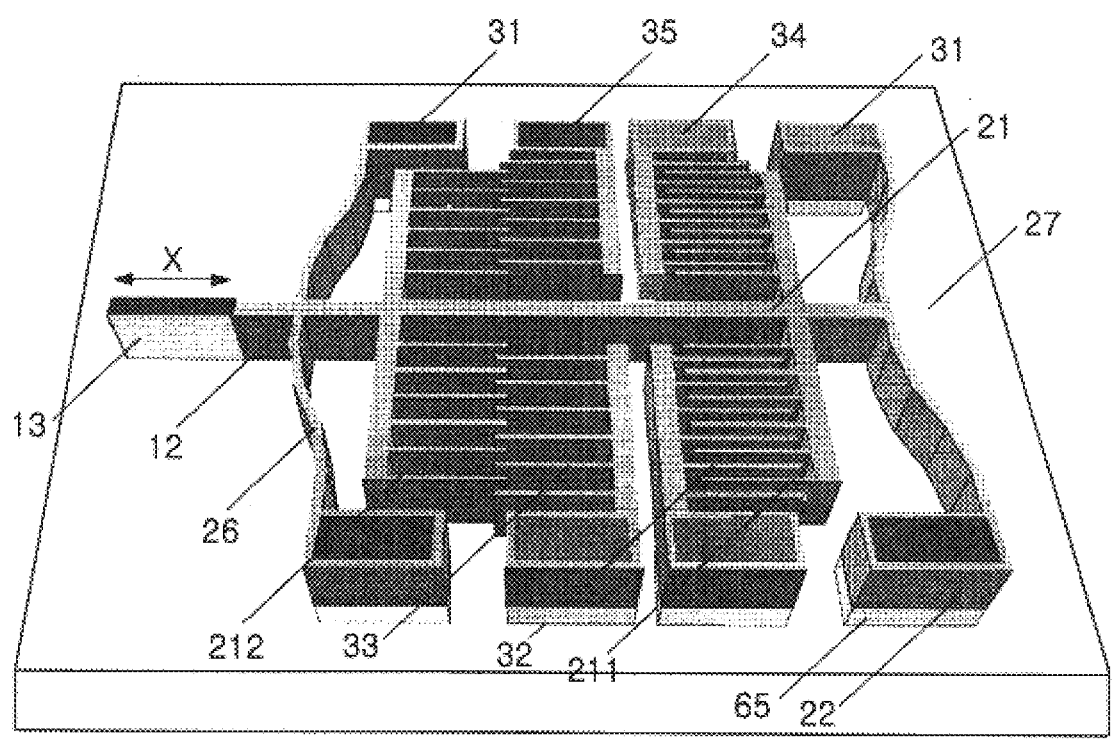

FIG. 2 shows a perspective view of an optical switch structure when an actuator of an optical switch is turned on.

Referring to FIG. 2, a mobile structure 21 with a mirror 13 on its end surface, is connected to the first and second leaf springs 26, wherein each of the leaf springs 26 has two ends. An end of the first leaf spring 26 is coupled to a side surface of the mobile structure 21 and an end of the second leaf spring 26 is coupled to a portion of the other side surface of the mobile structure, wherein the first and the second leaf springs 26 are opposite each other in such a way that the mobile structure 21 is capable of moving along an axis which is parallel to a surface of the mirror 13, thereby changing a light path of a light beam impinged onto the surface of the mirror 13. Each other ends of the leaf springs 26 is coupled to a pair of anchors 22, whereby an optical switch is fastened down to a substrate 27 at a predetermined position.

It is preferable that the mobile structure 21 is connected to at least two pairs of leaf springs 26 so as to stably move along the axis, as shown in FIG. 2.

Figure 3:
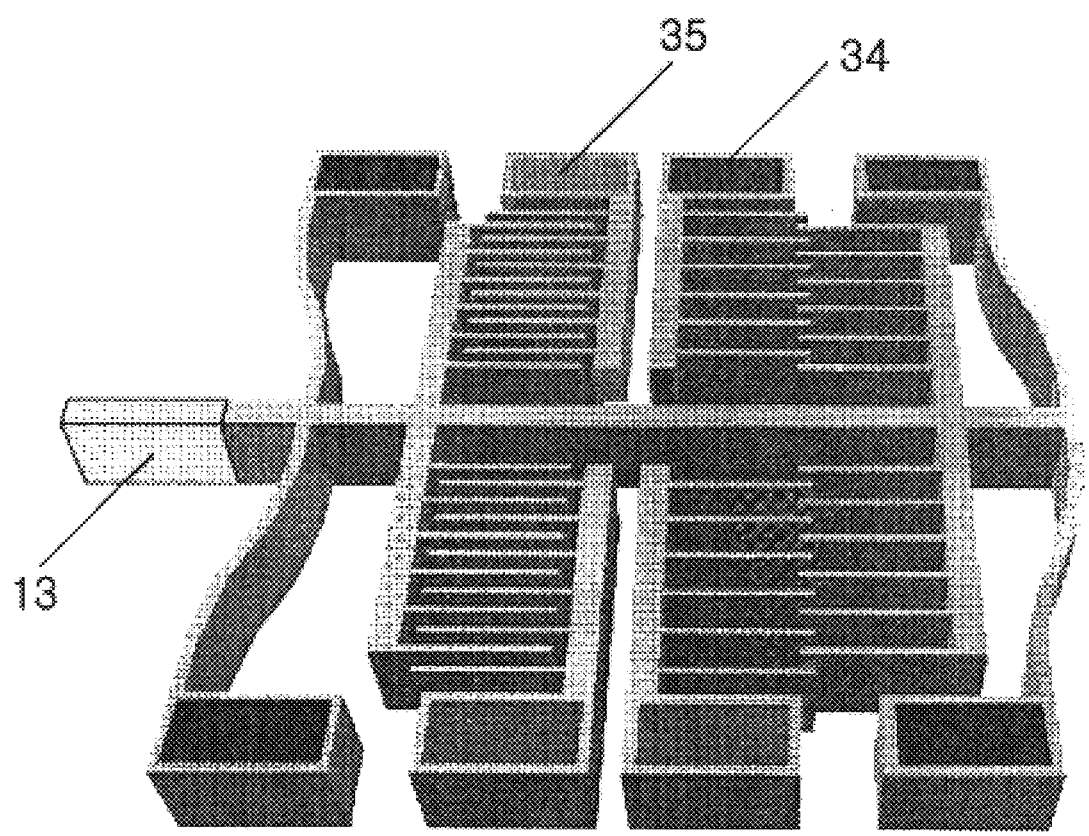
FIG. 3 is an optical switch in accordance with present invention, when the actuator of the optical switch is turned off.

FIGS. 2 and 3 are exemplary views showing an actuator to move the mobile structure 21. FIG. 2 shows the operation of the optical switch when the optical switch turns on. In this case, a voltage is applied not to a backward metal electrode 35 but to a forward metal electrode 34. The mobile structure 21 moves forward by an electrostatic force between a grounded forward movable electrode 211 and a forward fixed electrode 32 to change the direction of an optical signal to 90 degrees by a mirror surface 13 connected to a protrusion portion 12 of the mobile structure 21. On the other hand, FIG. 3 shows the operation of the optical switch when the optical switch turns off. In this case, a voltage is applied not to the forward metal electrode 34 but to the backward metal electrode 35. The mirror 13 of the mobile structure 21 moves backward to thereby allow the optical signal to go ahead.

At this time, if the leaf spring 26 is in the form of a straight line, as shown in FIG. 4A, and a voltage is not applied to the forward metal electrode 34, as shown in FIG. 4B, the mobile structure 21 moves back to an equilibrium position 42, represented by dotted lines, by a restoring force of the leaf springs 26. Similarly, if a voltage is not applied to the backward metal electrode 35, as shown in FIG. 4C, the mobile structure 21 moves back to the equilibrium position 42 by a restoring force of the leaf springs 26. Therefore, there is a problem that the straight line type leaf spring 26 does not have a latch-up function.

In order to reduce the power dissipation of the optical switch due to the above problem, it is required that the leaf spring 26 is designed in such a way that its shape has a latch-up function.

Figure 5A:
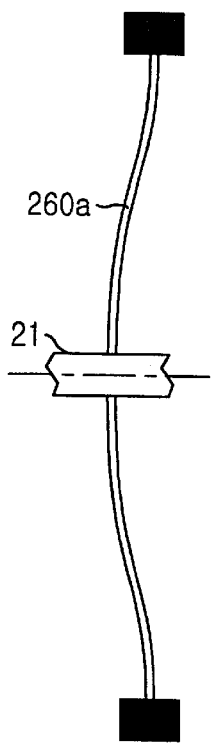
FIGS. 5A and 5B present an exemplary view an optical switch having at least a pair of springs in the form of a shallow arch in accordance with present invention.
Figure 5B:
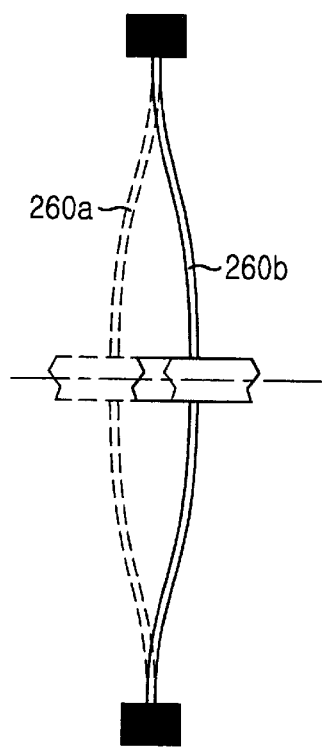

FIG. 5A depicts a leaf spring 260a in the shape of a shallow arch, wherein if at least a constant critical force is applied thereto in the opposite direction, the leaf spring 260a becomes an opposite buckling state. Therefore, the optical switch, provided with a shallow arched leaf spring 26 in accordance with the present invention, can maintain a stable state without continuously applying a voltage thereto, it achieves advantages that the optical switch does not need a high applying voltage and suffers from power dissipation.

And also, a critical force for the present shallow arch leaf spring 260 must be lowered to reduce an operating voltage thereof.

Figure 6A:
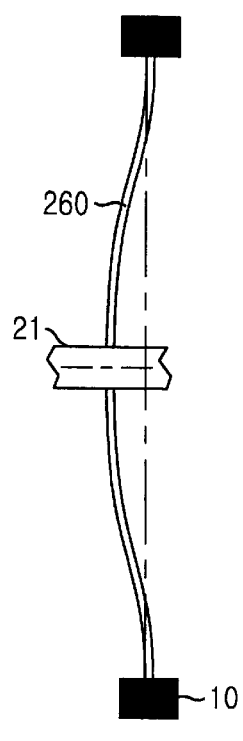
FIGS. 6A to 6C depict an exemplary view showing a connection method of a leaf spring in accordance with a preferred embodiment of the present invention.
Figure 6B:
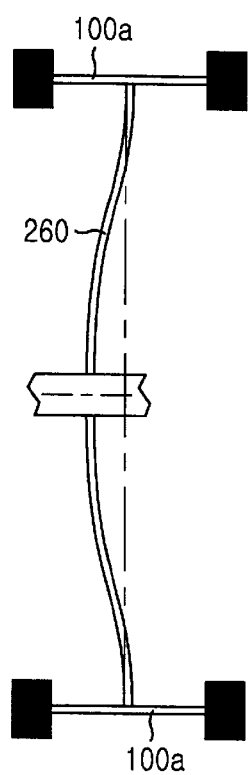
Figure 6C:
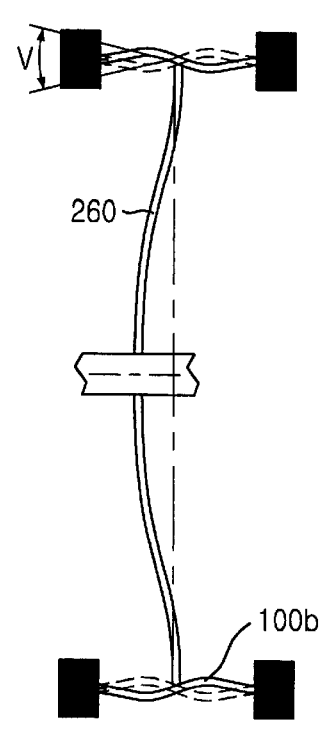

FIGS. 6A to 6C are exemplary views explaining a connection method of a shallow arch leaf spring in accordance with preferred embodiments of the present invention. Especially, FIG. 6A shows the shallow arch leaf spring, which is directly connected to portions 10 formed on the substrate 27. Although the thickness of the leaf spring 260 is constant, the leaf spring 260 must have a long length to reduce a critical force. However, it makes troublesome in optical alignment and in insertion loss because the optical switch becomes larger in size as well as the optical fibers become more distance therebetween.

Therefore, the connection portion of the leaf spring 260 is indirectly connected to the substrate 27 by introducing an elastic body between the connection portion and the substrate 27 to allow the leaf spring to get additional degree of freedom, which, in turn, reduce a required critical force for a leaf spring with a constant thickness. If the elastic body gives the degree of freedom to the connection portion in the direction of the axis, the actuating accuracy may be unstable.

As shown in FIG. 6B, in order to give the degree of freedom to the leaf spring 260 in the axial direction thereof, an I shape beam 100a or a multiple spring with a curvature is connected to the leaf spring 260 to reduce a critical force required in the reverse direction of the buckling. FIG. 6C is a leaf spring 260 provided with an S shape beam 100b which is indirectly connected to connection portions. This structure further reduces a critical force since the leaf spring 260 has the degree of freedom in the axial direction thereof as well as the degree of freedom due to its angle deflection at the connection portion. The above exemplifies a method for reducing a critical force by making an elastic boundary condition at both ends of the leaf spring 260.

In addition, it should be noted that the mobile structure 21 could be moved by an electrostatic force which is generated between two electrically separated structures by applying a voltage.

As shown in FIG. 2A, an electrostatic force is proportional to the square of the voltage applied thereto when mobile electrodes 211, 212 in the form of a comb shape are attached to the mobile structure 21 and fixed electrodes 32, 33 with the same comb shape are arranged in such a way that they are interlaced with facing to the mobile electrodes 211, 212. Alternatively, if electrodes facing each other are in the form of a flat plate, the electrostatic force is proportional to the square of a voltage applied thereto and is inversely proportional to the square of a distance between the electrodes. In this case, the electrostatic force depends on the distance between the electrodes.

And also, a thermal expansion force or a piezoelectric force can be replaced with the electrostatic force for actuating the mobile structure 21.

As described above, by applying a micromachining technology employing a buckling deflection to an optical switch, it is possible to make the optical switch compact in size with maintaining a conventional mechanical high performance. Further, it takes advantages of an integration and a reliability in implementing the optical switch because the optical switch can be fabricated by using semiconductor processes based on silicon.

In this case, the operation of the optical switch can be improved in stability by utilizing a crystalline silicon or a polycrystalline silicon as a material of the mobile structure 21. Another metal such as nickel may be used as a material of the mobile structure 21.

In addition, a sacrificial layer 65 can be formed on bottom of the structural layer to float the mobile structure 21 of the present optical switch, as shown in FIG. 2. It is preferable that a silicon dioxide is employed as the sacrificial layer to secure a stability and a selectivity between the silicon and the sacrificial layer.

By using a dry etching such as a reactive ion etching, both the mobile structure 21 and the mirror surface 13 can be fabricated simultaneously in a processing step. In case when the mobile structure 21 is made of a crystalline silicon, it takes an advantage of obtaining a flat mirror surface 13 since the mirror surface 13 can be additionally wet etched along the crystalline orientation of a KOH solution.

Figure 7:
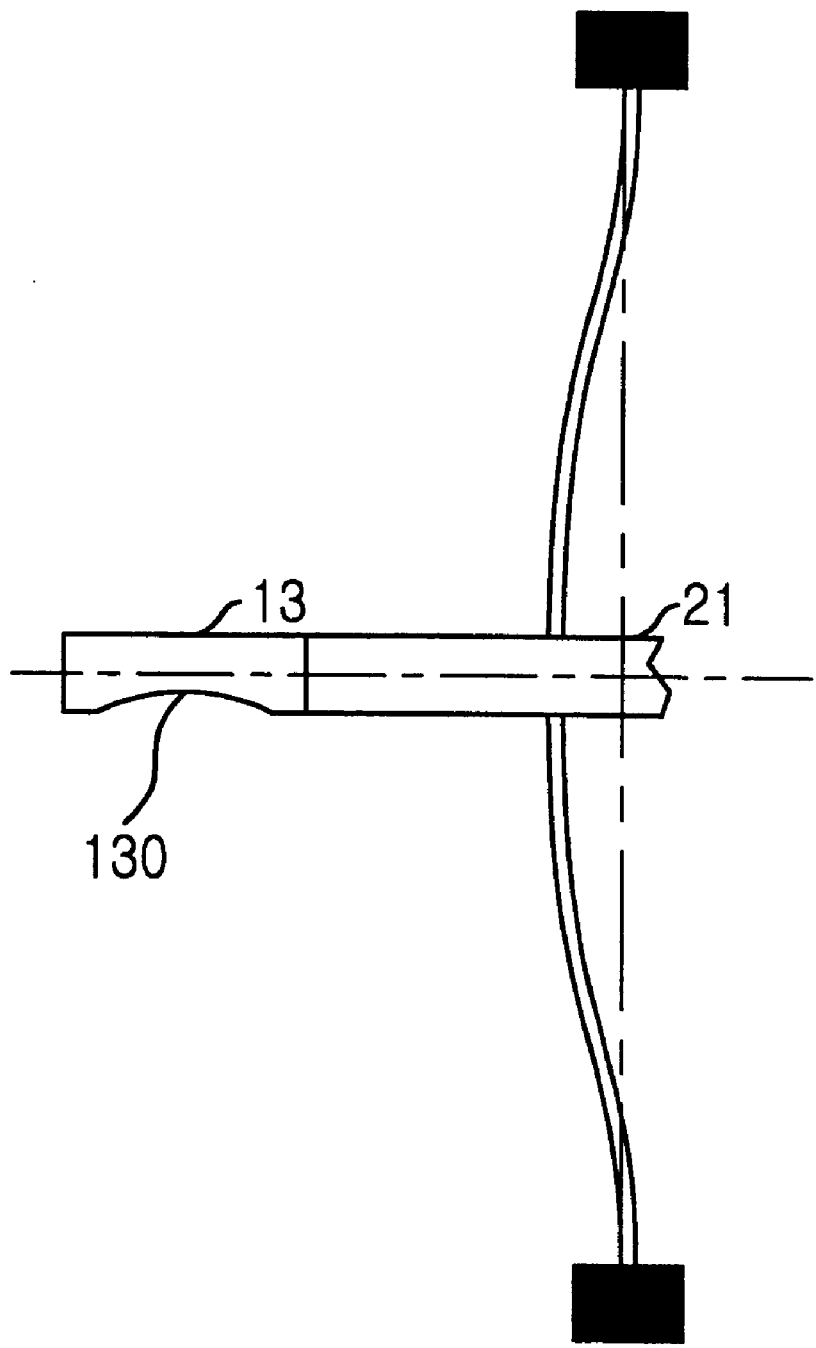
FIG. 7 illustrates a variation view of a mirror surface of the optical switch in accordance with another preferred embodiment of the present invention.

Since an optical signal has a problem of divergence during its traveling, it is preferable that the mirror surface 13 is in the form of a concave lens 130, as shown in FIG. 7. At this time, a mirror in the form of a cylindrical mirror designed in one dimension or in two dimensions can be replaced with the concave lens 130.

Further, the metal is deposited at the place where the optical signal is reflected to effectively reflect the optical signal impinged onto the mirror surface 13. The metal can be made of aluminum, gold or nickel.

In comparison with the prior art optical switches, the present invention described above is capable of improving the conventional problems in position accuracy, power dissipation, scalability and mass production, etc.

Further, by employing a shallow arch leaf spring having a latch-up structure, a device such as a current switch and the like can achieve an improved performance by lowering power dissipation.

While the present invention has been described with respect to the preferred embodiments, other modifications and variations may be made without departing from the spirit and scope of the present invention as set forth in the following claims.

What is claimed is:

1. An optical switch for selectively transmitting an optical signal to one of multiple optical paths for use in an optical communication, the optical switch comprising:

a mobile structure provided with a mirror surface at one end surface of the mobile structure to change an optical path by moving the mobile structure backward and forward along an axis parallel to the mirror surface according to a voltage applied to the optical switch;

at least a pair of leaf springs in the form of a shallow arch, wherein each of the leaf springs is connected to both side surfaces of the mobile structure in a leaf spring axis perpendicular to the mirror surface, respectively, to obtain a latch-up function such that the leaf springs maintain a stable state among buckling state and an opposite buckling state without continuously applying the voltage to the optical switch; and an actuator for moving the mobile structure.

2. The optical switch of claim 1, further comprising elastic bodies, introduced into connection portions of the leaf springs, respectively, for giving a degree of freedom to the connection portions in the direction of the leaf spring axis.

3. The optical switch of claim 2, wherein the elastic body is selected from a group consisting of an I-shaped beam, a multiple spring with a curvature and an S-shaped beam allowing angle deflection.

4. The optical switch of claim 1, wherein the actuator is operated by an electrostatic force which is proportional to the square of the voltage applied thereto when mobile electrodes in the form of a comb shape are attached to the mobile structure and fixed electrodes with the same comb shape are arranged in such a way that they are interlaced with facing to the mobile electrodes.

5. The optical switch of claim 1, wherein the actuator is operated by using a force selected from the group consisting of a thermal expansion force, electromagnetic force and a piezoelectric force.

6. The optical switch of claim 1, wherein the mobile structure is made of a material selected from a group consisting of a crystalline silicon and a polycrystalline silicon.

7. The optical switch of claim 6, further comprising a sacrificial layer formed at the bottom of the mobile structure, wherein the sacrificial layer is made of silicon dioxide.

8. The optical switch of claim 1, the mirror surface is designed in the form of a cylindrical mirror in one dimension or in two dimensions.

9. The optical switch of claim 8, wherein a material selected from a group consisting of aluminum, gold nickel is deposited on the mirror surface to improve reflectivity.

10. The optical switch of claim 1, wherein after the mobile structure and the mirror surface are fabricated simultaneously in a reactive ion etching process, the mobile structure and the mirror surface are planarized by wet etching along a crystalline orientation.

* * * * *